United States Patent
Wei et al.

(10) Patent No.: US 12,237,355 B2
(45) Date of Patent: Feb. 25, 2025

(54) SEMICONDUCTOR DEVICE AND SEMICONDUCTOR DIE

(71) Applicant: WUHAN XINXIN SEMICONDUCTOR MANUFACTURING CO., LTD., Hubei (CN)

(72) Inventors: Danqing Wei, Hubei (CN); Fei Chen, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 495 days.

(21) Appl. No.: 17/646,659

(22) Filed: Dec. 30, 2021

(65) Prior Publication Data
US 2023/0154961 A1 May 18, 2023

(30) Foreign Application Priority Data
Nov. 18, 2021 (CN) .......................... 202111372025.0

(51) Int. Cl.
*H01L 27/146* (2006.01)
*H01L 23/00* (2006.01)

(52) U.S. Cl.
CPC ........ *H01L 27/14634* (2013.01); *H01L 24/08* (2013.01); *H01L 2224/08145* (2013.01)

(58) Field of Classification Search
CPC ............... H01L 27/14634; H01L 24/08; H01L 2224/08145

(Continued)

(56) References Cited

U.S. PATENT DOCUMENTS 10,416,293 B2 * 9/2019 Buckley .................. G01S 17/10
2015/0200314 A1 * 7/2015 Webster ............ H01L 27/14636
257/438

(Continued)

FOREIGN PATENT DOCUMENTS

CN 104779259 A 7/2015
CN 104779317 A 7/2015

(Continued)

*Primary Examiner* — Igwe U Anya
(74) *Attorney, Agent, or Firm* — MUNCY, GEISSLER, OLDS & LOWE, P.C.

(57) ABSTRACT

A semiconductor device and a semiconductor die are disclosed. The semiconductor device includes: a SPAD wafer containing SPAD dies formed thereon with respective SPAD arrays; a TDC wafer containing TDC dies formed thereon with respective TDC arrays; and a logic wafer containing logic dies formed thereon with respective peripheral logic circuits. The SPAD wafer, TDC wafer and logic wafer are bonded in the sequence set forth. The TDC arrays and peripheral logic circuits are arranged on the TDC and logic wafers, respectively, and the SPAD arrays are bonded to the TDC arrays. The three wafers are bonded and integrated together to form the semiconductor device using a multi-wafer stacking technique. The increased integration of the semiconductor device means an increased fill factor of SPAD arrays for same size, resulting in improved photon detection efficiency of the semiconductor device and improved detection performance of single-photon detectors fabricated from the semiconductor device.

18 Claims, 1 Drawing Sheet

(58) Field of Classification Search
USPC .......................................... 257/444; 245/444
See application file for complete search history.

(56) References Cited

U.S. PATENT DOCUMENTS

| | | | |
|---|---|---|---|
| 2018/0026147 A1* | 1/2018 | Zhang | G04F 10/005 |
| | | | 257/292 |
| 2020/0018642 A1* | 1/2020 | Yin | G01S 7/4865 |
| 2020/0116838 A1* | 4/2020 | Erdogan | G01S 7/4863 |
| 2020/0278429 A1* | 9/2020 | Mandai | G01J 1/0228 |
| 2021/0156965 A1* | 5/2021 | Oyama | H01S 5/0239 |
| 2022/0102404 A1* | 3/2022 | Lee | H01L 27/14612 |
| 2022/0128690 A1* | 4/2022 | Suzuki | G01S 7/4865 |
| 2023/0030282 A1* | 2/2023 | Basavalingappa | ........................ |
| | | | H01L 27/1463 |
| 2023/0094219 A1* | 3/2023 | Takatsuka | H04N 25/773 |
| | | | 257/292 |

FOREIGN PATENT DOCUMENTS

| | | | | |
|---|---|---|---|---|
| CN | 105895645 A | | 8/2016 | |
| CN | 106898675 A | | 6/2017 | |
| CN | 112563340 A | * | 3/2021 | ......... H01L 31/0203 |
| TW | 201528487 A | | 7/2015 | |
| TW | 202133461 A | | 9/2021 | |
| WO | WO-2019/041267 A1 | | 3/2019 | |

\* cited by examiner

SEMICONDUCTOR DEVICE AND SEMICONDUCTOR DIE

CROSS-REFERENCES TO RELATED APPLICATION

This application claims the priority of Chinese patent application number 202111372025.0, filed on Nov. 18, 2021, the entire contents of which are incorporated herein by reference.

TECHNICAL FIELD

The present invention relates to the field of integrated circuit fabrication, and more particular to a semiconductor device and a semiconductor die.

BACKGROUND

A single-photon avalanche diode (SPAD) is a Geiger-mode (operating at a voltage higher than the breakdown voltage) avalanche photodiode capable of detecting single photons, which then liberate carriers due to the internal photoelectric effect, giving rise of a relatively large avalanche current that lasts for a very short duration. SPADs have found wide use in applications such as fluorescence lifetime imaging and three dimensional (3D) imaging thanks to their advantages including fast response and a large avalanche gain.

An important target for current research and development effort in semiconductor devices including a SPAD array and peripheral circuitry is improved performance and integration density. Current approaches involve reducing the size of either the SPADs or the peripheral circuitry. However, limited by dark counting and other factors, there is a lower limit for the size of SPADs. Therefore, there is a need for improved integration and effective area utilization of such semiconductor devices.

SUMMARY OF THE INVENTION

It is an objective of the present invention to provide a semiconductor device and a semiconductor die with increased integration and effective area utilization, an increased fill factor of SPAD arrays and improved photon detection efficiency of the semiconductor device.

The present invention provides a semiconductor device, including:
  a SPAD wafer containing a plurality of SPAD dies formed thereon with respective SPAD arrays;
  a TDC wafer containing a plurality of TDC dies formed thereon with respective TDC arrays; and
  a logic wafer containing a plurality of logic dies formed thereon with respective peripheral logic circuits,
  wherein the SPAD wafer, the TDC wafer and the logic wafer are bonded together one to another in this order.

Additionally, the SPAD dies, the TDC dies and the logic dies may be sized so as to have the same area.

Additionally, each SPAD die may contain m×n SPADs and each TDC die may contain p×q TDCs, wherein the number of SPADs on each SPAD die is equal to that of TDCs on each TDC die.

Additionally, the SPAD wafer may include a first semiconductor layer containing SPAD arrays, wherein the TDC wafer includes a second semiconductor layer containing the TDC arrays, and wherein the SPAD arrays are formed in a portion of the first semiconductor layer close to the TDC dies on the TDC wafer, and each SPAD is configured to receive photons from the side of the first semiconductor layer away from the TDC wafer.

Additionally, the TDC arrays may include a plurality of digital counters formed in the second semiconductor layer, each configured to count output pulses from the region of a respective one of the SPADs.

Additionally, the SPAD wafer may further include a first dielectric interconnect layer including a first dielectric layer and a first metal layer embedded in the first dielectric layer, wherein the TDC wafer further includes a second dielectric interconnect layer including a second dielectric layer and a second metal layer embedded in the second dielectric layer, and wherein the bonding is hybrid with the first dielectric layer facing the second dielectric layer and with the first metal layer facing the second metal layer.

Additionally, the peripheral logic circuits may be so coupled to receive and store outputs from the TDC arrays.

Additionally, the peripheral logic circuits may include at least one of quenching circuits, reset circuits, signal detection circuits, readout circuits, control circuits and static random access memories.

Additionally, the logic wafer may include a third semiconductor layer containing the static random access memories, wherein data from the TDC array is coupled and stored on the static random access memories.

Additionally, the semiconductor device may further include through silicon vias, which extend through the TDC wafer and contain a second interconnect layer electrically connecting the SPAD wafer to the logic wafer.

The present invention also provides a semiconductor die, including:
  a SPAD die formed thereon with a SPAD array;
  a TDC die formed thereon with a TDC array; and
  a logic die formed thereon with a peripheral logic circuit,
  wherein the SPAD die, the TDC die and the logic die are bonded together one to another in this order.

Additionally, the SPAD die, the TDC die and the logic die may be sized so as to have the same area, wherein the number of SPADs on the SPAD die is equal to that of TDCs on the TDC die.

The present invention is advantageous over the prior art as follows:

It provides a semiconductor device and a semiconductor die, the semiconductor device including: a SPAD wafer containing a plurality of SPAD dies formed thereon with respective SPAD arrays; a TDC wafer containing a plurality of TDC dies formed thereon with respective TDC arrays; and a logic wafer containing a plurality of logic dies formed thereon with respective peripheral logic circuits, wherein the SPAD wafer, the TDC wafer and the logic wafer are bonded together one to another in this order.

According to the present invention, the TDC arrays and the peripheral logic circuits are arranged on two separate wafers (the TDC and logic wafers), and the SPAD arrays on the SPAD wafer are bonded (bridged) to the respective TDC arrays on the TDC wafer. The three wafers are bonded and integrated together to form the semiconductor device using a multi-wafer stacking technique. In this way, integration of the SPAD wafer is significantly increased, avoiding the problem of spare regions and thus a wasted area of the SPAD wafer, as found in the prior art. The increased integration of the semiconductor device means an increased fill factor of the SPAD arrays for the same size, resulting in improved photon detection efficiency of the semiconductor device and improved detection performance of single-photon detectors fabricated from the semiconductor device.

In these figures,
10—SPAD wafer; 11—first semiconductor layer; 12—first dielectric interconnect layer; 12a—first dielectric layer; 12b—first metal layer; 13—SPAD array;
20—TDC wafer; 21—second semiconductor layer; 22—second dielectric interconnect layer; 22a—second dielectric layer; 22b—second metal layer; 23—TDC array;
30—logic wafer; 31—third semiconductor layer; 32—third dielectric layer;
1d—SPAD die; 2d—TDC die; 3d—logic die.

DETAILED DESCRIPTION

For ease of reference and clarity, descriptors, acronyms or abbreviations of technical terms that may be found hereunder are defined as follows:
SPAD: Single-Photon Avalanche Diode;
TDC: Time to Digital Converter.

As discussed in the Background section, semiconductor devices with improved integration and effective area utilization are being desired. Specifically, the fabrication of a semiconductor device may involve bonding a SPAD wafer to a logic wafer face to face. The bonding requires dies on one of the wafers to have the same size as those on the other. However, only TDC arrays on the logic wafer are required to be geometrically matched to respective SPAD arrays on the SPAD wafer, and it is not necessary for peripheral circuitry regions of the logic wafer around the TDC arrays to be brought into direct contact with aligned with the SPAD arrays. This leads to unused (or spare) regions of the SPAD wafer that face (oppose) the peripheral circuitry regions of the logic wafer. Consequently, a significant area of the SPAD wafer is wasted, leading in turn to suboptimal integration and performance of the semiconductor device.

In view of the above, in embodiments of the present invention, there are provided a semiconductor device and a method of fabricating the semiconductor device. These specific embodiments will be described in detail below with reference to the accompanying drawings. Advantages and features of the present invention will become more apparent from the following description. Note that the figures are provided in a very simplified form not necessarily drawn to exact scale for the only purpose of helping to explain the embodiments disclosed herein in a more convenient and clearer way.

Figure 1:
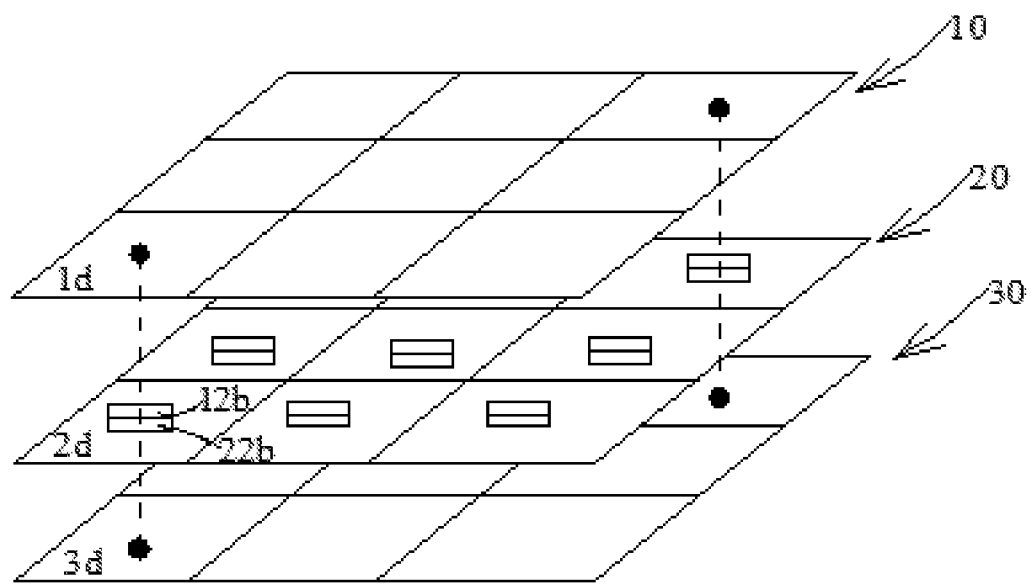
FIG. 1 is a schematic stereoscopic view of a semiconductor device according to an embodiment of the present invention.
Figure 2:
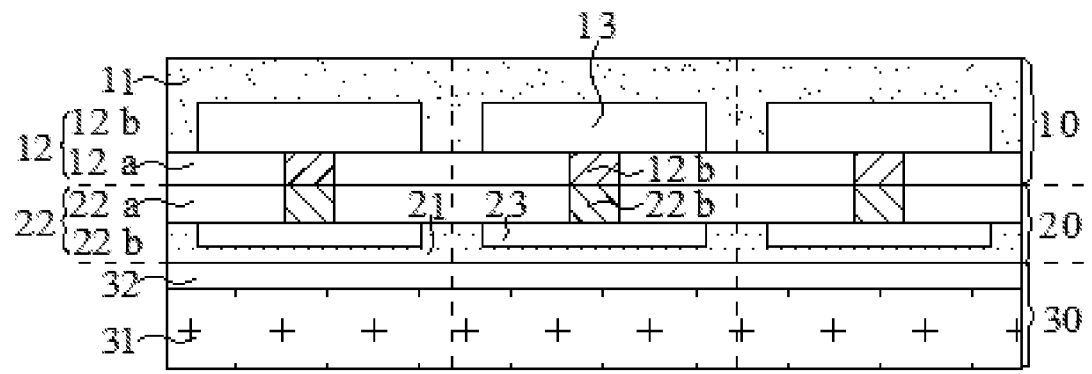
FIG. 2 is a schematic cross-sectional view of a semiconductor device according to an embodiment of the present invention.

As shown in FIGS. 1 and 2, a semiconductor device according to an embodiment of the present invention includes:
a SPAD wafer 10 containing a plurality of SPAD dies 1d formed thereon with respective SPAD arrays 13;
a TDC wafer 20 containing a plurality of TDC dies 2d formed thereon with respective TDC arrays 23; and
a logic wafer 30 containing a plurality of logic dies 3d formed thereon with respective peripheral logic circuits.

The SPAD wafer 10, the TDC wafer 20 and the logic wafer 30 are bonded together one to another in this order.

The SPAD arrays on the SPAD wafer are bridged (electrically coupled to) the respective TDC arrays on the TDC wafer at a size ratio of 1:1. Specifically, the semiconductor device is subsequently diced into individual semiconductor dies each included, stacked one above another in this order, a respective one of the SPAD dies, a respective one of the TDC dies and a respective one of the logic dies, which have the same size. Each SPAD die contains a respective one of the SPAD arrays, which may include, for example, m×n SPADs. Each TDC die contains a respective one of the TDC arrays, which may include, for example, p×q TDCs. The number of SPADs on each SPAD die (i.e., m×n) is equal to the number of TDCs on each TDC die (i.e., p×q), i.e., a ratio of 1:1 of the number of SPADs on each SPAD die to that of TDCs on each TDC die. Each SPAD on each SPAD die may occupy an area that may be either the same as or different from an area occupied by each TDC on each TDC die. The TDC arrays may be arranged in the same manner as the SPAD arrays. For example, each SPAD array may include m×n SPADs, with each TDC array including m×n TDCs. Alternatively, the TDC arrays may be arranged in a different manner from the SPAD arrays, but the number of SPADs on each SPAD die (i.e., m×n) is maintained equal to that of TDCs on each TDC die (i.e., p×q).

Specifically, the SPAD wafer 10, the TDC wafer 20 and logic wafer 30 may each include silicon, gallium arsenide or another semiconductor material. The SPAD wafer 10 may include a first semiconductor layer 11 and a first dielectric interconnect layer 12 containing the SPAD arrays 13. The SPAD arrays 13 may be formed in a portion of the first semiconductor layer close to the TDC dies on the TDC wafer, and each SPAD may be configured to receive photons from the side of the first semiconductor layer away from the TDC wafer. The first semiconductor layer 11 may be a silicon layer formed by epitaxial growth. The first dielectric interconnect layer 12 may include a first dielectric layer 12a and a first metal layer 12b embedded in the first dielectric layer 12a. The first semiconductor layer 11 may be adjacent to the first dielectric interconnect layer 12, or separated therefrom by a number of dielectric layers. In the latter case, a first interconnect layer may be deposited in TSVs extending through the dielectric layers in order to couple electrical signals in the SPAD arrays 13 to the first metal layer 12b. Specifically, output pulses may be transferred from the SPAD regions to the first metal layer 12b. The first interconnect layer may be a conductive material (e.g., one of copper, aluminum or polysilicon), and the SPAD regions may be coupled to digital counters in the TDC wafer 20 by the first interconnect layer and/or first metal layer 12b.

The TDC wafer 20 may include a second semiconductor layer 21 and a second dielectric interconnect layer 22. The TDC arrays 23 may be formed in the second semiconductor layer 21. The TDC arrays 23 may include a plurality of digital counters formed in the second semiconductor layer 21 so as to be electrically coupled to the SPAD arrays. With each SPAD region, at least one of the digital counters may be associated to allow fast, simultaneous read-out of the SPAD regions. The digital counters may be configured to count output pulses from the associated SPAD regions. Each of the digital counters may be activated to count the number of output pulses within a time window and output a digital signal indicating the number. Each digital counter may include an amplifier for amplifying any received output pulse.

Each SPAD may be reverse-biased by a bias voltage VBIAS exceeding its breakdown voltage so that a single photon-induced carrier can trigger an avalanche multiplication of electrons in an electric current at the SPAD's output, resulting in an output pulse. When receiving the resulting output pulse, the associated digital counter responsively increments its count.

The second semiconductor layer 21 may be a silicon layer formed by epitaxial growth. The second dielectric interconnect layer 22 may include a second dielectric layer 22a and a second metal layer 22b embedded in the second dielectric layer 22a. The bonding may be accomplished with the first dielectric layer 12a facing the second dielectric layer 22a and the with the first metal layer 12b facing the second metal layer 22b using hybrid bonding involving metal-to-metal and dielectric-to-dielectric bonding. The SPAD arrays 13 may be electrically coupled to the TDC arrays 23 via the first metal layer 12b and the second metal layer 22b. The TDC arrays may be configured to record the times of reception of photons at the SPADs.

The peripheral logic circuits of the logic dies 3d on the logic wafer 30 may be so coupled to receive and store outputs from the TDC arrays. The peripheral logic circuits may include at least one of quenching circuits, reset circuits, signal detection circuits, readout circuits, control circuits, other functional circuits of image sensors and large-area static random access memories (SRAM). Each quenching circuit may include a plurality of quenching elements each being so coupled to quench an avalanche of a respective SPAD region by lowering its bias voltage.

Count data from the digital counters in the TDC arrays 23 on the TDC wafer 20 may be read by the readout circuits on the logic wafer 30. The readout circuits may include amplification circuits. The control circuits may be coupled to the SPAD arrays and/or the readout circuits to control operational characteristics of the SPAD arrays. For example, each control circuit may simultaneously activate all the corresponding digital counters within a time window to enable operation in a global shutter mode.

The logic wafer may include a third semiconductor layer 31 and a third dielectric layer 32. The static random access memories may be formed in the third semiconductor layer 31, and data from the TDC arrays may be coupled and stored in the static random access memories. For example, data from a plurality of digital counters in the TDC arrays may be coupled and stored in the static random access memories (SRAM). As an example, the static random access memories (SRAM) may be part of frame memories. In this case, fast burst imaging is possible.

In one embodiment, the logic wafer 30 may be (electrically) coupled indirectly to the SPAD wafer 10 via the TDC wafer 20. In another embodiment, the logic wafer 30 may be (electrically) coupled directly to the SPAD wafer 10 via the second interconnect layer in the through silicon vias extending through the TDC wafer 20. The through silicon vias extending through the TDC wafer 20 may be, for example, micro through silicon vias (µTSV), and the second interconnect layer in the through silicon vias may be a conductive material (e.g., one of copper, aluminum or polysilicon) which directly (electrically) couples the logic wafer 30 to the SPAD wafer 10. In a further embodiment, first pads may be formed on the side of the SPAD wafer 10 away from the TDC wafer 20, and second pads on the side of the logic wafer 30 away from the TDC wafer 20. The first pads may be electrically connected to the second pads, for example, by gold wires.

As an example, the semiconductor device according to this embodiment may be used to produce SPAD image sensors and may further include a number of microlenses each for a respective one of the SPAD regions. Each microlens may be configured to guide (focus) incident photons to the region of the respective SPAD array. Additionally, each microlens may be configured such that incident photons are guided to the respective SPAD region via a respective color filter. For the SPAD regions, respective individual digital counters may be arranged to allow fast, simultaneous readout of the SPAD regions, enabling operation of the image sensor in a global shutter mode. The SPAD arrays may be imaging arrays such as backside illuminated (BSI) image sensors or two-dimensional (2D) arrays of pixels. In one embodiment, each pixel may include a SPAD. The pixels may be arranged into rows and columns to capture image data of a person, place or object, which may be then processed to reproduce a 2D image of the person, place or object. The SPAD image sensors of this example can provide high-speed imaging with low photosensitivity, which is barely achievable by conventional sensor architectures.

The semiconductor device may include joint (bond) interfaces in addition to the stacked SPAD, TDC and logic wafers. By forming the digital counters on a single wafer (the TDC wafer) and the peripheral logic circuits on another wafer (the logic wafer), there is a room on the SPAD wafer that is sufficient to accommodate the SPAD arrays, resulting in a substantial increase in the SPAD arrays' fill factor.

In embodiments of the present invention, there is also provided a method for fabricating a semiconductor device, which includes:
  providing a SPAD wafer containing a plurality of SPAD dies formed thereon with respective SPAD arrays;
  providing a TDC wafer containing a plurality of TDC dies formed thereon with respective TDC arrays;
  providing a logic wafer containing a plurality of logic dies formed thereon with respective peripheral logic circuits; and
  bonding the SPAD wafer, the TDC wafer and the logic wafer together one to another in this order.

Specifically, as shown in FIGS. 1 and 2, the SPAD wafer 10, the TDC wafer 20 and the logic wafer 30 may be separately formed, and a custom process may be used to optimize the formation of the SPAD arrays on the SPAD wafer. CMOS processes may be performed to form the TDC arrays on the TDC wafer and the peripheral logic circuits on the logic wafer.

The SPAD arrays, the TDC arrays and the peripheral logic circuits are formed on the SPAD, TDC and logic wafers, respectively. This means the SPAD arrays, the TDC arrays and the peripheral logic circuits may be formed in respective semiconductor layers before the SPAD, TDC and logic wafers are bonded together.

The SPAD wafer 10 may be bonded to the TDC wafer 20 face to face.

The bonded TDC wafer 20 may be thinned from the side thereof away from the SPAD wafer 10. In a particular example, the thinning may be accomplished by a planarization process based on chemical mechanical polishing.

The logic wafer 30 may be bonded face to face to the TDC wafer 20 at the side thereof away from the SPAD wafer 10.

The SPAD wafer 10 may be thinned from the side thereof away from the TDC wafer 20 using a planarization process based on chemical mechanical polishing, and a metal layer may be formed as a redistribution layer (RDL) on the side of the SPAD wafer 10 away from the TDC wafer 20. The RDL may be electrically connected to the SPAD arrays 13 in order to pick up electrical signals from the SPAD arrays 13.

In embodiments of the present invention, there is also provided a semiconductor die, which can be taken as an individual die resulting from dicing the semiconductor device described above. The semiconductor die includes:
a SPAD die formed thereon with a SPAD array 13;
a TDC die formed thereon with a TDC array 23; and
a logic die formed thereon with a peripheral logic circuit, wherein the SPAD die, the TDC die and the logic die are bonded together one to another in this order.

The SPAD, TDC and logic dies may be sized to have the same area, and the number of SPADs on the SPAD die may be equal to that of TDCs on the TDC die.

The SPAD die may include a first semiconductor layer 11 formed therein with the SPAD array 13.

The TDC die may include a second semiconductor layer 21 formed therein with the TDC array 23.

The SPAD array may include a plurality of pixels. Each of the pixels may include a SPAD region formed in a portion of the first semiconductor layer close to the TDC wafer and may be configured to receive photons from the side of the first semiconductor layer away from the TDC wafer.

The TDC array may include a plurality of digital counters formed in the second semiconductor layer. Each of the digital counters may be configured to count output pulses from a corresponding SPAD region.

The peripheral logic circuit may include at least one of a quenching circuit, a reset circuit, a signal detection circuit, a readout circuit, a control circuit and a static random access memory.

In summary, the present invention provides a semiconductor device, a method of fabricating the semiconductor device, as well as a semiconductor die. The semiconductor device includes: a SPAD wafer containing a plurality of SPAD dies formed thereon with respective SPAD arrays; a TDC wafer containing a plurality of TDC dies formed thereon with respective TDC arrays; and a logic wafer containing a plurality of logic dies formed thereon with respective peripheral logic circuits, wherein the SPAD wafer, the TDC wafer and the logic wafer are bonded together one to another in this order.

According to the present invention, the TDC arrays and the peripheral logic circuits are arranged on two separate wafers (the TDC and logic wafers), and the SPAD arrays on the SPAD wafer are bonded (bridged) to the respective TDC arrays on the TDC wafer. The three wafers are bonded and integrated together to form the semiconductor device using a multi-wafer stacking technique. In this way, integration of the SPAD wafer is significantly increased, avoiding the problem of spare regions and thus a wasted area of the SPAD wafer, as found in the prior art. The increased integration of the semiconductor device means an increased fill factor of the SPAD arrays for the same size, resulting in improved photon detection efficiency of the semiconductor device and improved detection performance of single-photon detectors fabricated from the semiconductor device.

The embodiments disclosed herein are described in a progressive manner, with the description of each embodiment focusing on its differences from others. Reference can be made between the embodiments for their identical or similar parts. Since the method embodiments correspond to the device embodiments, they are described relatively briefly, and reference can be made to the device embodiments for details in them.

While the invention has been described above with reference to several preferred embodiments, it is not intended to be limited to these embodiments in any way. In light of the teachings hereinabove, any person of skill in the art may make various possible variations and changes to the disclosed embodiments without departing from the scope of the invention. Accordingly, any and all such simple variations, equivalent alternatives and modifications made to the foregoing embodiments without departing from the scope of the invention are intended to fall within the scope thereof.

What is claimed is:

1. A semiconductor device, comprising:
   a single-photon avalanche diode (SPAD) wafer containing a plurality of SPAD dies formed thereon with respective SPAD arrays;
   a time to digital converter (TDC) wafer containing a plurality of TDC dies formed thereon with respective TDC arrays; and
   a logic wafer containing a plurality of logic dies formed thereon with respective peripheral logic circuits,
   wherein the SPAD wafer, the TDC wafer and the logic wafer are bonded in the sequence set forth, and wherein each of the plurality of SPAD dies, each of the plurality of TDC dies and each of the plurality of logic dies are sized so as to have a same area.

2. The semiconductor device according to claim 1, wherein each of the plurality of SPAD dies contains multiple SPADs and each of the plurality of TDC dies contains multiple TDCs, and wherein a number of the SPADs on each SPAD die is equal to a number of the TDCs on each TDC die.

3. The semiconductor device according to claim 2, wherein each SPAD on each SPAD die occupies an area the same as an area occupied by each TDC on each TDC die.

4. The semiconductor device according to claim 2, wherein each SPAD on each SPAD die occupies an area different from an area occupied by each TDC on each TDC die.

5. The semiconductor device according to claim 2, wherein:
   the SPAD wafer comprises a first semiconductor layer containing SPAD arrays;
   the TDC wafer comprises a second semiconductor layer containing the TDC arrays; and
   the SPAD arrays are formed in a portion of the first semiconductor layer close to the TDC dies on the TDC wafer, and each SPAD is configured to receive photons from the side of the first semiconductor layer away from the TDC wafer.

6. The semiconductor device according to claim 5, wherein
   the TDC arrays comprise a plurality of digital counters formed in the second semiconductor layer, each configured to count output pulses from the region of a respective one of the SPADs.

7. The semiconductor device according to claim 5, wherein:
   the SPAD wafer further comprises a first dielectric interconnect layer comprising a first dielectric layer and a first metal layer embedded in the first dielectric layer;
   the TDC wafer further comprises a second dielectric interconnect layer comprising a second dielectric layer and a second metal layer embedded in the second dielectric layer; and
   the bonding is hybrid with the first dielectric layer facing the second dielectric layer and with the first metal layer facing the second metal layer.

8. The semiconductor device according to claim 1, wherein the TDC arrays are arranged in a same manner as the SPAD arrays.

9. The semiconductor device according to claim 1, wherein the peripheral logic circuits are so coupled to receive and store outputs from the TDC arrays.

10. The semiconductor device according to claim 1, wherein the peripheral logic circuits include at least one of quenching circuits, reset circuits, signal detection circuits, readout circuits, control circuits and static random access memories.

11. The semiconductor device according to claim 10, wherein the logic wafer comprises a third semiconductor layer containing the static random access memories, and wherein data from the TDC array is coupled and stored on the static random access memories.

12. The semiconductor device according to claim 1, further comprising through silicon vias, which extend through the TDC wafer and contain a second interconnect layer electrically connecting the SPAD wafer to the logic wafer.

13. The semiconductor device according to claim 1, a side of the SPAD wafer away from the TDC wafer has a first pad formed thereon, and a side of the logic wafer away from the TDC wafer has a second pad formed thereon, the first pad electrically connected to the second pad.

14. A semiconductor die, comprising:
a single-photon avalanche diode (SPAD) die formed thereon with a SPAD array;
a time to digital converter (TDC) die formed thereon with a TDC array; and
a logic die formed thereon with a peripheral logic circuit, wherein the SPAD die, the TDC die and the logic die are bonded in the sequence set forth, and wherein the SPAD die, the TDC die and the logic die are sized so as to have a same area.

15. The semiconductor die according to claim 14, wherein the SPAD die contains multiple SPADs and the TDC die contains multiple TDCs, and wherein a number of the SPADs on the SPAD die is equal to a number of the TDCs on the TDC die.

16. The semiconductor die according to claim 15, wherein each SPAD on each SPAD die occupies an area the same as an area occupied by each TDC on each TDC die.

17. The semiconductor die according to claim 15, wherein each SPAD on each SPAD die occupies an area different from an area occupied by each TDC on each TDC die.

18. The semiconductor die according to claim 14, wherein the TDC array is arranged in a same manner as the SPAD array.

\* \* \* \* \*